United States Patent
Tsai et al.

(10) Patent No.: US 8,853,013 B2
(45) Date of Patent: Oct. 7, 2014

(54) METHOD FOR FABRICATING FIELD EFFECT TRANSISTOR WITH FIN STRUCTURE

(75) Inventors: Shih-Hung Tsai, Tainan (TW); Rai-Min Huang, Taipei (TW); Chien-Ting Lin, Hsinchu (TW)

(73) Assignee: United Microelectronics Corp., Science-Based Industrial Park, Hsin-Chu ( * ) Notice: Subject to any disclaimer, the term of this patent is extended or adjusted under 35 U.S.C. 154(b) by 556 days.

(21) Appl. No.: 13/213,092

(22) Filed: Aug. 19, 2011

(65) Prior Publication Data
US 2013/0045576 A1 Feb. 21, 2013

(51) Int. Cl.
*H01L 21/336* (2006.01)
*H01L 29/78* (2006.01)

(52) U.S. Cl.
CPC .................. *H01L 29/7854* (2013.01)
USPC ....................................... 438/151

(58) Field of Classification Search
CPC .................................... H01L 29/7854
USPC .................... 438/151; 257/E21.409
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,855,607 B2 | 2/2005 | Achuthan | |
| 6,921,963 B2 | 7/2005 | Krivokapic | |
| 7,013,446 B2 | 3/2006 | Ohba | |
| 7,018,551 B2 | 3/2006 | Beintner | |
| 7,087,477 B2 | 8/2006 | Fried | |
| 7,091,551 B1 | 8/2006 | Anderson | |
| 7,112,495 B2 | 9/2006 | Ko | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,521,324 B2 | 4/2009 | Ohmi | |
| 7,531,437 B2 | 5/2009 | Brask | |
| 7,569,857 B2 | 8/2009 | Simon | |
| 7,592,270 B2 | 9/2009 | Teo | |
| 2004/0195624 A1 | 10/2004 | Liu | |
| 2005/0051825 A1 | 3/2005 | Fujiwara | |
| 2005/0153490 A1* | 7/2005 | Yoon et al. | 438/164 |
| 2006/0099830 A1 | 5/2006 | Walther | |
| 2006/0177977 A1 | 8/2006 | Chan | |
| 2006/0228840 A1* | 10/2006 | Chau et al. | 438/164 |
| 2006/0286729 A1 | 12/2006 | Kavalieros | |
| 2007/0015365 A1 | 1/2007 | Chen | |
| 2007/0072376 A1 | 3/2007 | Chen | |
| 2007/0108528 A1 | 5/2007 | Anderson | |
| 2007/0158756 A1 | 7/2007 | Dreeskornfeld | |
| 2007/0218661 A1 | 9/2007 | Shroff | |
| 2008/0061366 A1 | 3/2008 | Liu | |
| 2008/0157208 A1 | 7/2008 | Fischer | |
| 2008/0176402 A1* | 7/2008 | Kim et al. | 438/694 |
| 2009/0057759 A1 | 3/2009 | Obradovic | |
| 2009/0124097 A1 | 5/2009 | Cheng | |

(Continued)

*Primary Examiner* — Walter H Swanson
(74) *Attorney, Agent, or Firm* — Winston Hsu; Scott Margo

(57) ABSTRACT

A method for fabricating a field effect transistor with fin structure includes the following sequences. First, a substrate is provided and at least a fin structure is formed on the substrate. Then, an etching process is performed to round at least an upper edge in the fin structure. Finally, a gate covering the fin structure is formed.

12 Claims, 5 Drawing Sheets

(56) References Cited

U.S. PATENT DOCUMENTS

| | | |
|---|---|---|
| 2009/0200494 A1 | 8/2009 | Hatem |
| 2009/0242964 A1 | 10/2009 | Akil |
| 2009/0269916 A1* | 10/2009 | Kang et al. .................. 438/587 |
| 2010/0044783 A1 | 2/2010 | Chuang |
| 2010/0048027 A1 | 2/2010 | Cheng |
| 2010/0072553 A1 | 3/2010 | Xu |
| 2010/0129994 A1 | 5/2010 | Awad |
| 2010/0144121 A1 | 6/2010 | Chang |
| 2010/0167506 A1 | 7/2010 | Lin |

* cited by examiner

METHOD FOR FABRICATING FIELD EFFECT TRANSISTOR WITH FIN STRUCTURE

BACKGROUND OF THE INVENTION

1. Field of the Invention

The present invention generally relates to a method for fabricating field effect transistors (FETs) with fin structure. More particularly, the present invention relates to a method for fabricating a field effect transistor having a fin structure with rounded top edges.

2. Description of the Prior Art

With the trend in the industry being towards scaling down the size of metal oxide semiconductor transistors (MOS), three-dimensional or non-planar transistor technology, such as fin field effect transistor technology (Fin FET) has been developed to replace planar MOS transistors. The three-dimensional structure of a fin FET increases the overlapping area between the gate and the fin structure of the silicon substrate, and accordingly, the channel region is more effectively controlled. The drain-induced barrier lowering (DIBL) effect and short channel effect is therefore reduced. The channel region is also longer under the same gate length, and thus the current between the source and the drain is increased. In addition, threshold voltage of the fin FET can further be controlled by adjusting the work function of the gate.

In a conventional three-dimensional structure of the FET with fin structure, sharp corners or edges generally lie between the top surface and the sidewalls of the fin structure, which cause a higher electrical field strength to accumulate in these sharp corners or edges. Generally speaking, the non-uniform distribution of the electrical field may cause carriers at the gate channel region to move at different speeds, therefore reducing the electrical performance of the device. Furthermore, if electrical field strength is over the maximum sustaining ability of the gate insulation layer, structures around the gate insulation layer will collapse, thereby reducing the reliability of the device.

In order to overcome the above-mentioned drawbacks, there is a need to provide a novel method for fabricating a fin FET which can avoid the accumulation of the electrical field and therefore improve the reliability of a semiconductor device.

SUMMARY OF THE INVENTION

To address these and other objectives, the present invention provides a method for fabricating a FET with fin structure. First, a substrate is provided and at least a fin structure is formed on the substrate. Then, an etching process is performed to round at least an upper edge in the fin structure. Finally, a gate covering the fin structure is formed.

In another aspect, the present invention provides a method for fabricating a FET with fin structure. First, a substrate is provided and at least a fin structure is formed on the substrate having a patterned hard mask on a top surface of the substrate. Then, a pull back process is performed to expose a portion of the top surface of the fin structure from the patterned hard mask, an etching process is performed to round at least an upper edge in the fin structure, and consequently, the patterned hard mask is removed. Finally, a gate covering the fin structure is formed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Figure 1:
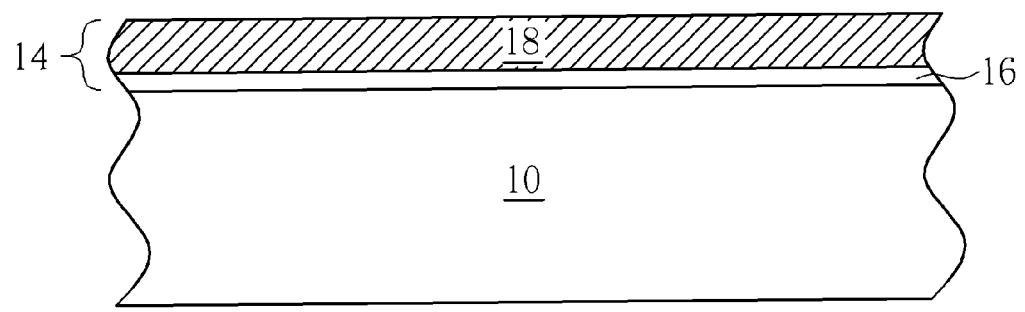
FIGS. 1-9 are schematic, cross-sectional view diagrams showing a method for fabricating a field effect transistor with fin structure having rounded top edges according to one embodiment.

Please refer to FIGS. 1-9, which are schematic, cross-sectional diagrams showing a method for fabricating a FET with a fin structure having rounded top edges according to one embodiment. It shall be noted that the FET is a multi-gate MOSFET, such as fin FET or tri-gate MOSFET. As shown in FIG. 1, a substrate 10 is provided. According to this first embodiment, the substrate 10 is a bulk silicon substrate. A hard mask 14 is then formed on the substrate 10. The hard mask 14 may comprise a single layer or multiple layer structure, for example, The hard mask 14 has a silicon oxide layer 16 and a silicon nitride layer 18. Depending on different process requirements, at least two active regions are defined on the substrate 10, such as an NMOS region (not shown) and a PMOS region (not shown).

Figure 2:
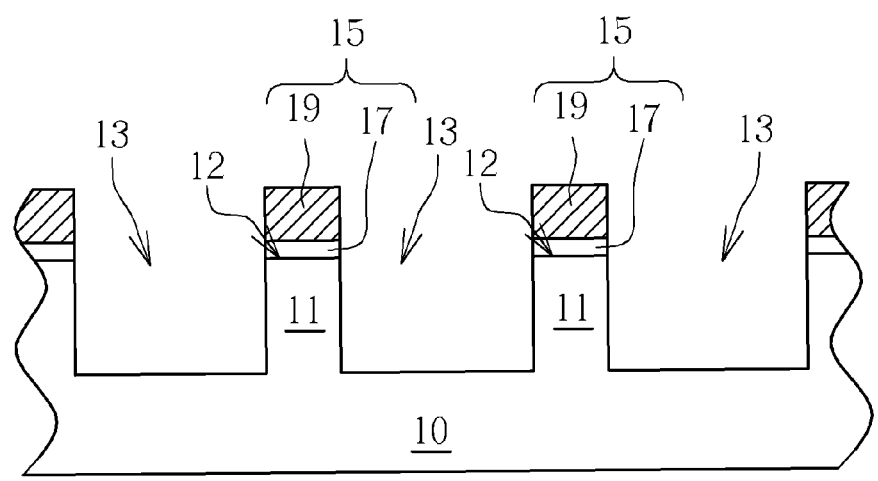

As depicted in FIG. 2, a portion of the substrate 10 is etched away to form at least a fin structure 11 thereon, wherein the forming steps are described as follows: first, a patterned hard mask 15 is formed by etching part of the hard mask 14 and the patterned hard mask 15 is used to define the location of the fin structure. Then, an etching process is performed to transfer a pattern of the patterned hard mask 15 to the substrate 10, thereby forming the fin structure 11 and at least a shallow trench 13 at the same time. At this point, the location of the fin structure 11 is defined and a top surface 12 of the fin structure 11 is covered with the patterned hard mask 15. It should be noted that, at this time, the fin structure 11 has a planar top surface 12 and a plurality of side walls perpendicular to the top surface 12.

Figure 3:
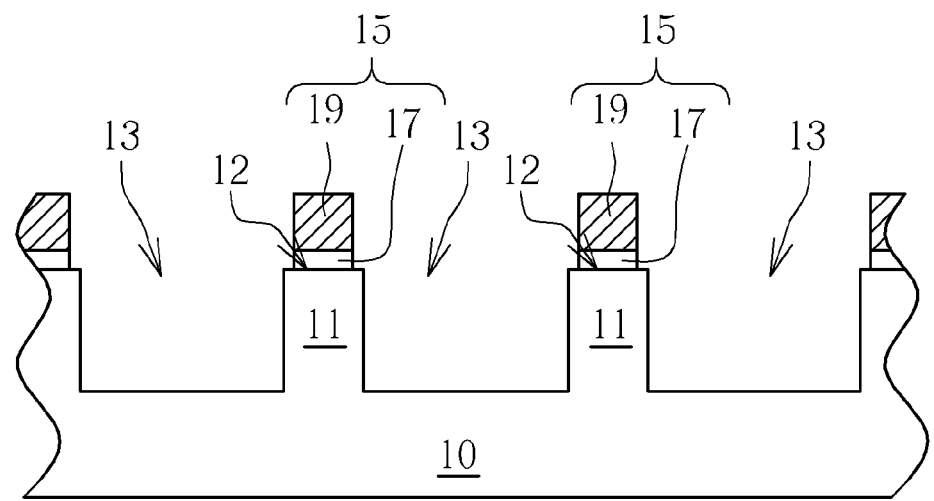

As shown in FIG. 3, by performing a pull back process to the patterned hard mask 15, a portion of the top surface 12 in the fin structure 11 can be exposed from the patterned hard mask 15. It is known that the exposed degree of the top surface 12 will affect a rounding degree of the curve in the fin structure 11, therefore the duration time and the chemical composition of the pull back process can be adjusted to fit certain process requirements. The above-mentioned pull back process is only active to the upper patterned hard mask 19 and lower patterned hard mask 17. The pull back process includes a wet etch process, e.g. hydrofluoric acid mixed with ethylene glycol or a isotropic plasma etch process to selectively etch the patterned hard mask 15, but it is not limited thereto.

Figure 4:
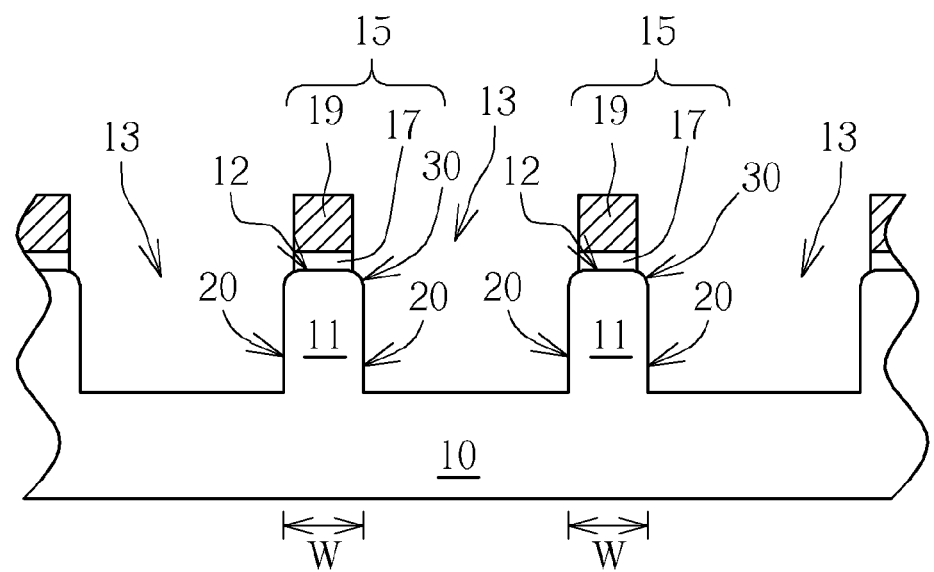

Please refer to FIG. 4. An etching process, such as a plasma etching process, is carried out to round at least top edges 30 or top corners in the fin structure 11. It should be noted that the term "top edges or top corners" means edges between the top surface 12 and the sidewalls 20 of the fin structure 11, such that the term "top edges or top corners" is not limited to describe the regions depicted in FIG. 4. In addition, by additionally adjusting the side-etching capability of the plasma etching process, the etching process may etch the sidewalls 20 of the fin structure 11, thereby reducing the width W of the fin structure 11. Through the above-mentioned rounding process, the accumulation of the electrical field in the top edges can be eliminated, which not only can facilitate the flow uniformity of the current in the channel region but also can reduce the probability of electrical break down in gate dielectric layer, and therefore increase the performance and reliability of the fin FET device.

Figure 5:
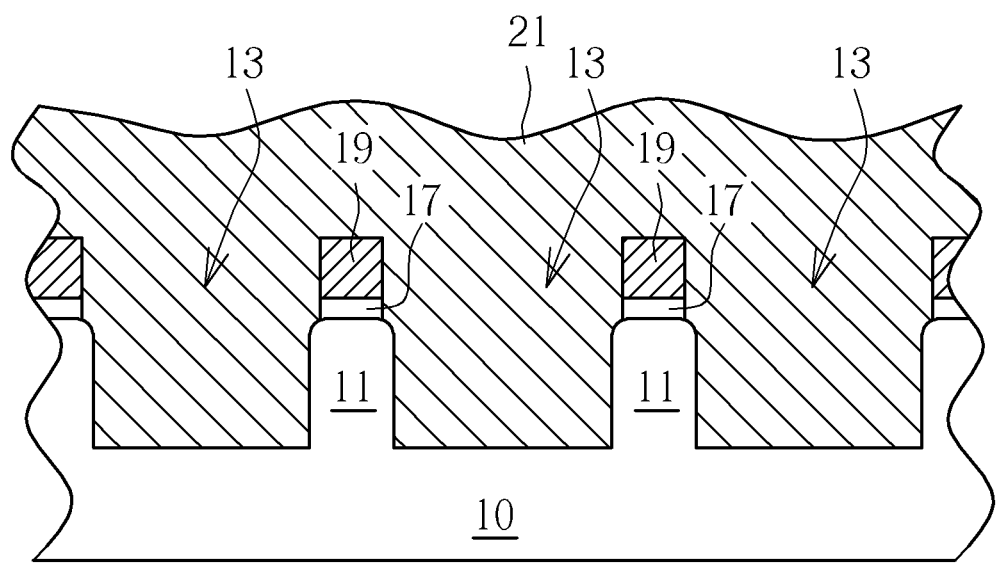

Referring to FIG. 5, an insulation layer 21, e.g. silicon oxide is formed on the substrate 10, to cover the fin structure 11 and fill up the shallow trench 13. The process utilized to form an insulation layer 21 includes a high density plasma CVD (HPCVD) process, a sub atmosphere CVD (SACVD) process or a spin on dielectric (SOD) process.

Figure 6:
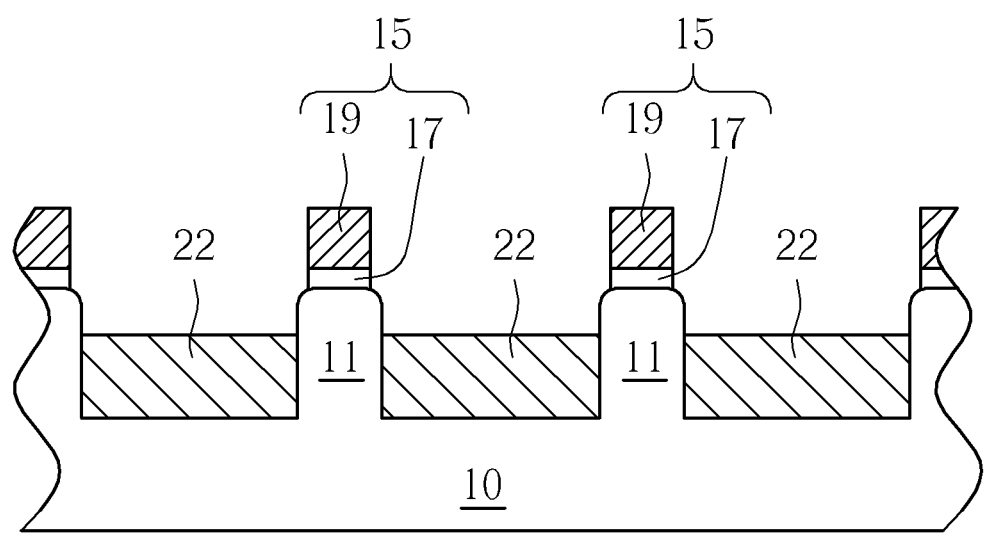

Subsequently, as depicted in FIG. 6, an etching back process is performed to remove a portion of the insulation layer 21 until the top surface of the insulation layer 21 is lower than the top surface 12 of the fin structure 11, thereby forming at least a shallow trench isolation 22 in the substrate 10 between each of the fin structures 11. In another embodiment of the invention, before applying the etching back process, a polishing may be adopted to make the surface of the insulation layer 21 slightly higher or lower than the surface of the patterned hard mask 15. Optionally, an anti punch process may be further provided before or after the formation of the shallow trench isolation 22.

Figure 7:
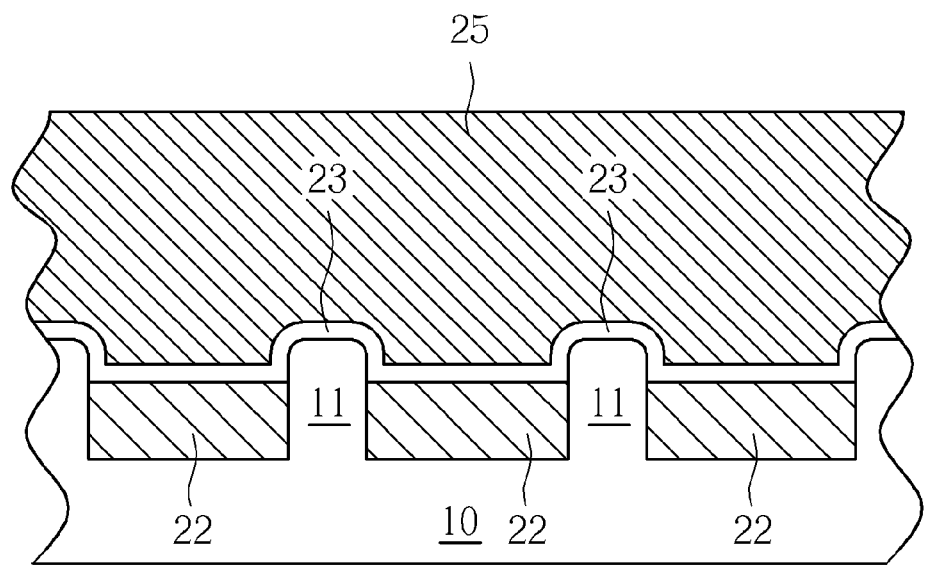

As illustrated in FIG. 7, an etching process is performed to remove the patterned hard mask 15. In one embodiment, when the patterned hard mask 15 is SiN, it can be removed by using hot phosphoric acid. In another embodiment, a strained silicon layer (not shown) can further be formed on the sidewall and/or the top surface of the fin structure 11, followed by forming a gate dielectric layer 23 and a gate material layer 25 to cover the fin structure 11. The gate dielectric layer 23 can be, for example, a silicon layer or a high-k layer.

In the above-mentioned first embodiment, the substrate 10 is bulk silicon. According to a second embodiment, a substrate 10 is a silicon-on-insulator (SOI) substrate. The differences between the first embodiment and the second embodiment are that an insulation layer (not shown) exists between the fin structure and the substrate 10, and a shallow trench isolation as depicted in FIG. 6 is not disposed between each of the fin structures 11. Accordingly, the fabricating process in this embodiment is approximately similar to FIGS. 1-7. Therefore, when describing this second embodiment, reference may be made to the preceding figures. Please refer again to FIGS. 3-4, which show an etch back process and a rounding process, respectively. First, an etch back process is performed to etch the patterned hard mask 15, such that a portion of the top surface 12 in the fin structure 11 can be exposed from the patterned hard mask 15. Then, an etching process, such as a plasma etching process, is carried out to round at least a top edge 30 or top corner in the fin structure 11. It should be noted that a deposition process of the shallow trench isolation 22 as illustrated in FIGS. 5-6 can be omitted in this embodiment since an insulation layer is disposed between the fin structure 11 and the substrate 10. The following sequence is similar to FIG. 7. The advantage of SOI substrate 10 is that it can provide superior ground connection and thermal dissipation for reducing interference and cost.

Figure 8:
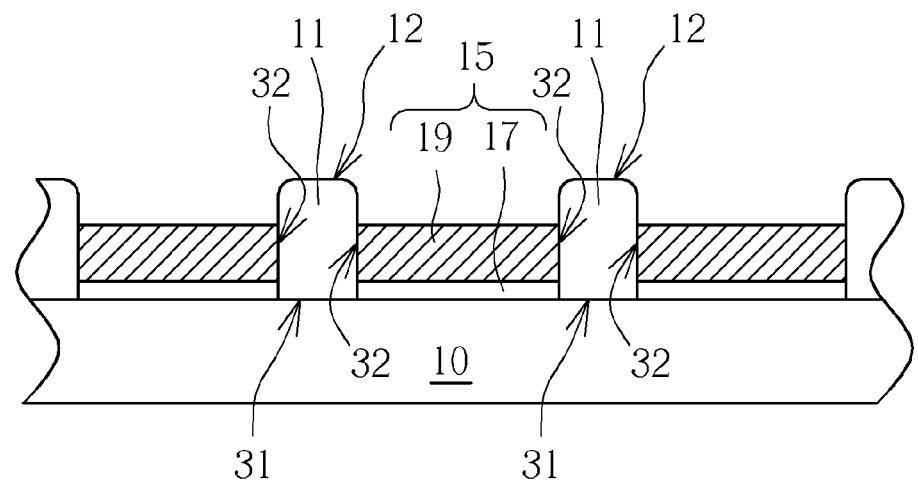

FIG. 8 is a schematic, cross-sectional view diagram showing a method of fabricating a FET with fin structure having rounded top edges according to still another embodiment of the invention. The main difference between the third embodiment and the first embodiment is that at least a fin structure is formed on the bulk silicon substrate 10 via a selective epitaxial growth process (SEG). The fabrication process of this third embodiment is again similar to the first embodiment illustrated in FIGS. 1-7; hence, the following description is focused on the difference between these two embodiments. First, similar to FIG. 1, a substrate 10 having a hard mask 14 thereon is provided. Then, referring to FIG. 8, a photolithography and etching process is carried out to form at least a trench 32 butted contacting the patterned hard mask 15, where the hard mask 15 is used to define the location of each fin structure 11. A selective epitaxial growth process is performed by using an exposed surface 31 as a seeding layer to grow a fin structure 11. It is known that fin structure 11 grows up from the surface 31 at the bottom of the trench 32, and finally protrudes over the top surface of the patterned hard mask 15. Depending on the different fabrication demands, after finishing the selective epitaxial growth process, a cyclic thermal annealing may be further performed to reduce defects inside the fin structure 11. Finally, an etching process, such as a plasma etching process, is carried out to round at least a top edge 30 or top corner in the fin structure 11. The fin structure described above includes a silicon layer, silicon-germanium layer or a combination thereof. It should be emphasized here that, according to this embodiment, the fin structure 11 is located on the surface 31 which is not covered by the patterned hard mask 15. Therefore, no patterned hard mask 15 exists on the top surface of the fin structure 11. In this case, there is no need to carry out a pull back process before rounding the top edges of the fin structure 11.

Figure 9:
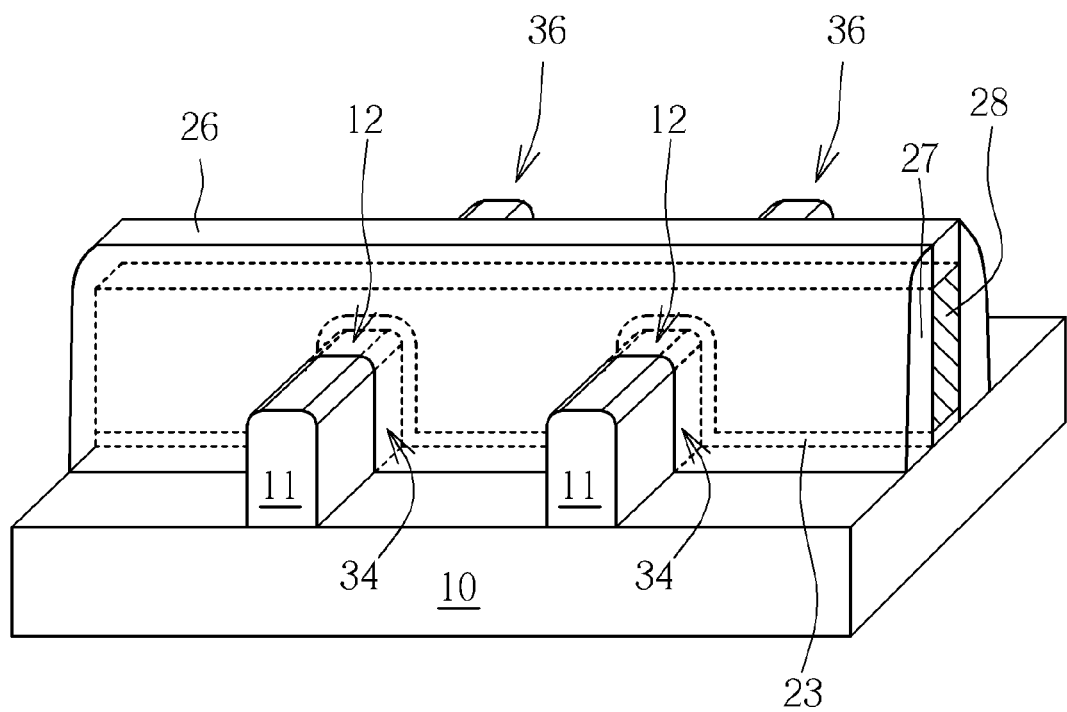

Various semiconductor processes such as MOS process including the polysilicon gate or metal gate are also performed. As shown in FIG. 9, according to one embodiment of the invention, a multi-gate FET with metal gate structure fabricating by a gate-first process is illustrated. First, a patterned cap layer 26 is formed on the gate material layer 25, which comprises metal composition, for defining the position of each of the gates in the NMOS region (not shown) and/or the PMOS region (not shown). The patterned cap layer 26 may serve as a mask layer, as the dielectric layer 23 with high-K composition and the gate material layer 25 are etched to form a plurality of gate structure 28 partially overlapping the fin structures 11. A lightly doped source/drain (not shown) is selectively formed in the fin structure 11 not covered by the gate structure 28. The spacer 27 is formed on the sidewalls of the gate structure 28, where the spacer 27 may be a monolayered structure or multilayered structure or may include a liner, or be a composition thereof. Then, a source/drain region 34/36 is formed in the fin structures 11 at both sides of the gate structure 28 through an ion implantation process by using the spacer 27 and the cap layer 26 as a mask and implanting suitable n-type or p-type dopants. Furthermore, an annealing process could be carried out to activate the source/drain region. Moreover, despite the light doped source/drain region, the spacer 27, and the source/drain region 34/36 being formed sequentially in this exemplary embodiment, the order of fabricating the spacer and the doped regions could also be adjusted according to the demands of the product; these modifications are all within the scope of the present invention.

Another embodiment of the invention, as similar to FIG. 9, is a method for fabricating a gate-last fin FET. The process for fabricating a gate-last multi-gate FET follows the above-mentioned gate-first process when the gate material 25 depicted in the related FIGS. 7-8 is a polysilicon. In this embodiment, a channel region (not shown) in fin structure 11 is covered with at least a high-K dielectric layer (not shown), at least a work function tuning layer (not shown), and at least a metal conductive layer (not shown). The high-K dielectric layer described in above gate-first and gate-last process includes hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or any combination thereof. The metal conductive layer may include a low resistance material such as copper (Cu) or any combination thereof. A barrier layer (not shown) is selectively disposed between the high-k gate dielectric layer and the work function tuning layer and between the work function tuning layer and the metal conductive layer, and the material of the barrier layer may include titanium (Ti), titanium nitride (TiN), tantalum (Ta) or tantalum nitride (TaN).

Still referring to FIG. 9, at this point, a multi-gate MOSFET with fin structure is fabricated via the gate-first or the gate-last process described above. It is worth noting that, in above embodiments, three contact faces between the fin structure 11 and the dielectric layer 23 functions as a carrier channel whose width is wider than a channel width in conventional planar MOSFET. When a driving voltage is applied, the multi-gate MOSFET produces a double on-current comparing to the conventional planar MOSFET. The above-mentioned multi-gate MOSFET, however, is not limited to a tri-gate MOSFET. According to different requirements, a patterned hard mask 15 may exist between the top surface 12 of the fin structure 11 and the dielectric layer 23, therefore, only two contact faces between the fin structure 11 and the dielectric layer 23. A FET with such two contact faces is called fin field effect transistor (Fin FET)

To summarize, the present invention provides a method for fabricating a FET with fin structure, wherein the fin structure in the FET has at least a rounded top edge. Through the above-mentioned rounding process, the accumulation of the electrical field in the top edges can be eliminated, which not only can facilitate the flow uniformity of the current at channel region but also can reduce the probability of electrical break down in the gate dielectric layer, and therefore increase the performance and reliability of the fin FET device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a field effect transistor with fin structure, comprising:
    providing a substrate;
    forming a patterned hard mask on the substrate;
    transferring pattern of the patterned hard mask into the substrate to form at least a fin structure on the substrate;
    after the step of forming the fin structure, performing an etching process to round at least an upper edge in the fin structure;
    before the step of performing the etching process, pulling back the patterned hard mask to expose portions of a top surface of the fin structure from the patterned hard mask;
    forming a gate covering the fin structure; and
    forming a source and a drain at each side of the gate.

2. A method for fabricating a field effect transistor with fin structure according to claim 1, wherein the substrate is a bulk silicon substrate or a silicon-on-insulator (SOI) substrate.

3. A method for fabricating a field effect transistor with fin structure according to claim 1, wherein the step of pulling back the patterned hard mask comprises a wet etch process or plasma etch process.

4. A method for fabricating a field effect transistor with fin structure according to claim 1, further comprising:
    after the step of performing the etching process, forming at least an insulation layer on the substrate, wherein the insulation layer butted contacts the fin structure.

5. A method for fabricating a field effect transistor with fin structure according to claim 1, wherein the fin structure comprises a silicon layer, silicon-germanium layer or a combination thereof.

6. A method for fabricating a field effect transistor with fin structure according to claim 1, wherein the etching process etches at least a sidewall of the fin structure.

7. A method for fabricating a field effect transistor with fin structure, comprising:
    providing a substrate;
    forming at least a fin structure on the substrate having a patterned hard mask on a top surface of the substrate;
    performing a pull back process to expose portions of a top surface of the fin structure from the patterned hard mask;
    performing an etching process to round at least an upper edge in the fin structure;
    removing the patterned hard mask;
    forming a gate covering the fin structure; and
    forming a source and a drain at each side of the gate.

8. A method for fabricating a field effect transistor with fin structure according to claim 7, wherein the substrate comprises a bulk silicon substrate or silicon-on-insulator substrate.

9. A method for fabricating a field effect transistor with fin structure according to claim 7, wherein the fin structure comprises a silicon layer, silicon-germanium layer or a combination thereof.

10. A method for fabricating a field effect transistor with fin structure according to claim 7, wherein the pull back process comprises a wet etch process or plasma etch process.

11. A method for fabricating a field effect transistor with fin structure according to claim 7, wherein the etching process can etch at least a sidewall of the fin structure.

12. A method for fabricating a field effect transistor with fin structure according to claim 7, further comprising:
    after the step of performing the etching process to round at least the upper edge in the fin structure, forming at least an insulation layer on the substrate, wherein the insulation layer contacts the fin structure.

* * * * *